(12) United States Patent
Goller

(10) Patent No.: US 7,701,066 B2
(45) Date of Patent: Apr. 20, 2010

(54) SEMICONDUCTOR WAFER, PANEL AND ELECTRONIC COMPONENT WITH STACKED SEMICONDUCTOR CHIPS, AND ALSO METHOD FOR PRODUCING SAME

(75) Inventor: Bernd Goller, Otterfing (DE)

(73) Assignee: Infineon Technologies AG, Neubiberg (DE)

( * ) Notice: Subject to any disclaimer, the term of this patent is extended or adjusted under 35 U.S.C. 154(b) by 543 days.

(21) Appl. No.: 10/555,858

(22) PCT Filed: May 4, 2004

(86) PCT No.: PCT/DE2004/000936

§ 371 (c)(1),
(2), (4) Date: Jan. 15, 2007

(87) PCT Pub. No.: WO2004/100261

PCT Pub. Date: Nov. 18, 2004

(65) Prior Publication Data

US 2007/0108580 A1     May 17, 2007

(30) Foreign Application Priority Data

May 7, 2003   (DE) ................ 103 20 579

(51) Int. Cl.
*H01L 23/48*  (2006.01)
*H01L 23/58*  (2006.01)
*H01L 21/4763*  (2006.01)

(52) U.S. Cl. ............... 257/777; 257/888; 257/778; 257/774; 438/637; 438/108

(58) Field of Classification Search .......... 257/777, 257/688, 778, 774; 438/637, 108
See application file for complete search history.

(56) References Cited

U.S. PATENT DOCUMENTS

| | | | |
|---|---|---|---|
| 5,767,280 A | 6/1998 | Robey et al. | |
| 6,359,335 B1 | 3/2002 | Distefano et al. | |
| 6,369,448 B1 | 4/2002 | McCormick | |
| 2001/0015496 A1* | 8/2001 | Watase et al. | 257/737 |
| 2001/0038151 A1* | 11/2001 | Takahashi et al. | 257/778 |
| 2002/0042164 A1 | 4/2002 | Funaya et al. | |
| 2002/0103303 A1 | 8/2002 | Kodemura | |
| 2002/0130404 A1 | 9/2002 | Ushijima et al. | |
| 2003/0068852 A1* | 4/2003 | Towle et al. | 438/200 |

FOREIGN PATENT DOCUMENTS

| | | |
|---|---|---|
| DE | 101 27 009 | 12/2002 |
| DE | 101 48 043 | 1/2003 |
| WO | 02/15266 | 2/2002 |
| WO | 02/33751 | 4/2002 |
| WO | WO0233751 | * 4/2002 |

* cited by examiner

*Primary Examiner*—Long Pham
*Assistant Examiner*—Steven H Rao
(74) *Attorney, Agent, or Firm*—Dicke, Billig & Czaja, PLLC

(57) ABSTRACT

A semiconductor wafer, a panel, and an electronic component, and also methods for producing them is disclosed. In this context, the electronic component has a stack of two semiconductor chips. The top stacked semiconductor chip is thin-ground and is arranged using flip-chip technology on a central region of the bottom semiconductor chip. An edge region of the bottom semiconductor chip contains vias through a leveling layer to a rewiring plane, which for its part carries external contacts.

22 Claims, 4 Drawing Sheets

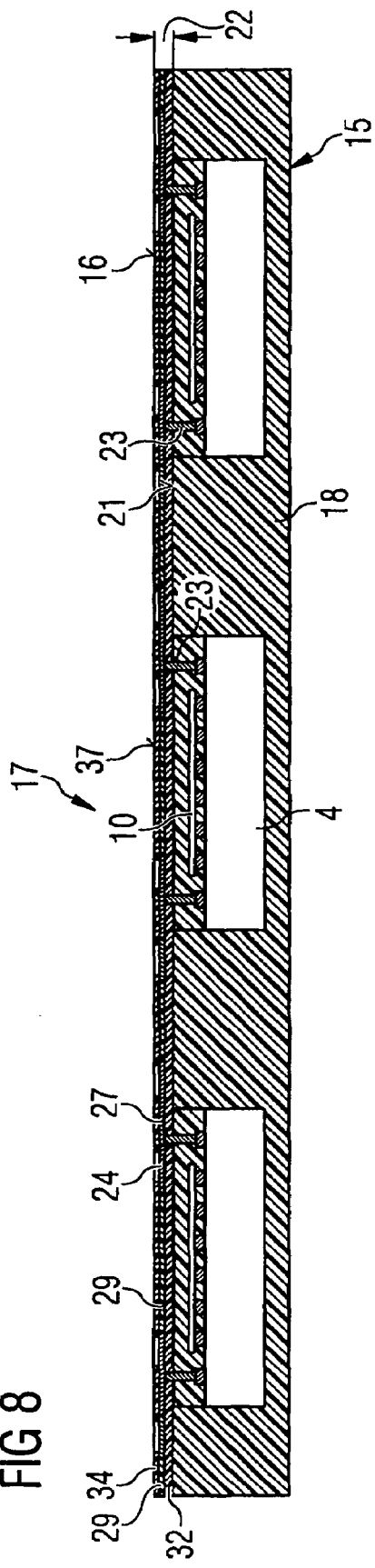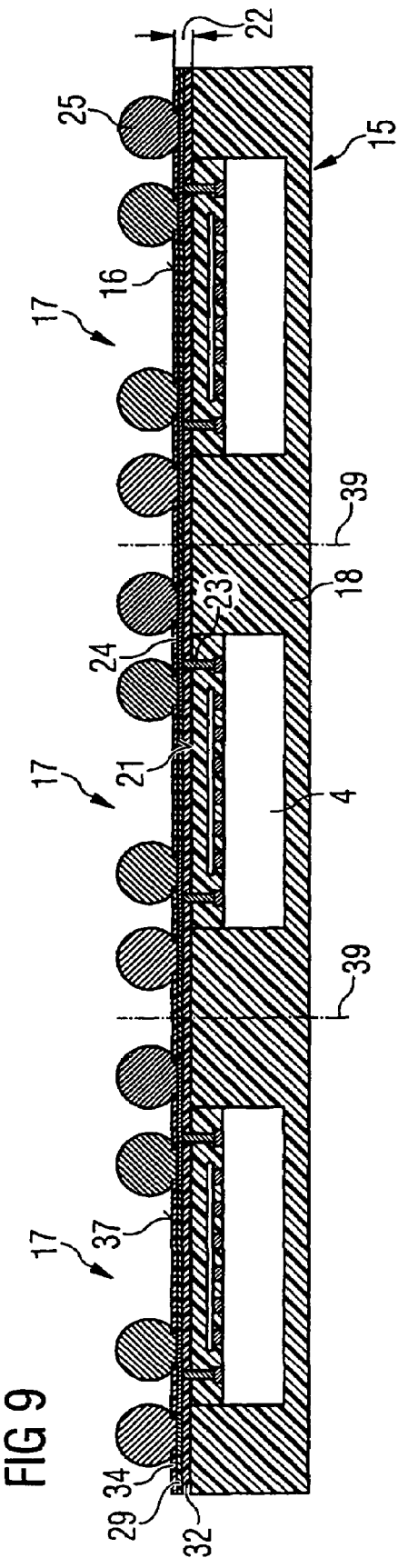

SEMICONDUCTOR WAFER, PANEL AND ELECTRONIC COMPONENT WITH STACKED SEMICONDUCTOR CHIPS, AND ALSO METHOD FOR PRODUCING SAME

CROSS REFERENCE TO RELATED APPLICATION

This Utility Patent Application claims the benefit of the filing date of Application Number DE 103 20 579.9, filed May 7, 2003 and International Application No. PCT/DE2004/000936, filed May 4, 2004, all of which are herein incorporated by reference.

FIELD OF THE INVENTION

The invention relates to a semiconductor wafer, a panel and an electronic component with stacked semiconductor chips, and also methods for producing them.

BACKGROUND

With increasing demands on level of miniaturization and circuit density for electronic components, the production methods for such components are becoming more complex, failure rates are becoming higher and the aim of minimizing cost is becoming ever more crucial. In this, case, the transition from internal electrical connections between the semiconductor chips to external connections using external contacts, which must not be below a prescribed handling or connection size, is a problem.

SUMMARY

The present invention provides an electronic component having internal electrical connections and having external contacts using suitable semiconductor wafers and suitable panels which allows continuing miniaturization and sufficient external handling or connection size and which reduces production costs.

In line with one embodiment of the invention, a semiconductor wafer is first of all provided which has a top side which has semiconductor chip positions arranged in rows and columns with integrated circuits for first semiconductor chips. These semiconductor chip positions each have a central region with central pads and an edge region with edge pads. The central pads are electrically conductively connected to the edge pads via interconnects.

In addition, the semiconductor wafer has second semiconductor chips with second pads. In this case, the second semiconductor chips are fitted on the central regions of the first semiconductor chips using flip-chip technology, so that the first central pads are electrically connected to the second pads. A leveling layer on the top side of the semiconductor wafer provides a level, new top side beneath which the second semiconductor chips are embedded in the leveling layer.

The advantage of this semiconductor wafer is that it already has at least one stacked second semiconductor chip in any component position, this stack existing even before the semiconductor wafer is split, which means that all further processing can take place simultaneously for a plurality of chip positions.

The number of second pads on the second semiconductor chip corresponds to the number of central pads in each semiconductor chip position, so that the connection between first central pads and second pads means that both the signal connections and the supply connections of the second semiconductor chip are in contact with the corresponding connections in the semiconductor positions for the first semiconductor chip. In addition, the number of second pads corresponds to the number of edge pads which are connected to the central pads via interconnect. This means that signals from the second pads of the second semiconductor chip can be forwarded via the central pads, the interconnects and the edge pads. On the other hand, the edge pads, the interconnects, the central pads and the second pads can be used to route supply currents and supply voltage simultaneously both to the first semiconductor chip and to the second semiconductor chip.

The central pads can be connected to the second pads via flip-chip contacts. Although such flip-chip contacts on the second semiconductor chip are smaller than external contacts on an electronic component, they require a minimum size of second pads or of central pads in order to ensure electrical connection. By contrast, the edge pads, which are not dependent on the formation of connection contacts, can be reduced in size arbitrarily down to a technologically demanded minimum level, for example photographic resolution or electron-optical resolution, depending on the technology used. The interconnects, which are provided in approximately the same number as the central pads in each semiconductor chip position, can be used to connect all signal and supply connections from both semiconductor structures, namely from the first semiconductor chip and from the second semiconductor chip, to appropriate edge contacts.

The area requirement for the edge contacts can be minimized in line with the minimal area requirement of each individual edge contact. Accordingly, it is possible for the packing density of the edge contact bases to be made greater than the packing density of the central pads. This provides further assistance in minimizing electronic components with semiconductor chips.

To reduce the volume requirement of the second semiconductor chips stacked on the semiconductor chip positions, the thickness of the semiconductor chips can be less than the thickness of the semiconductor wafer. Since the second semiconductor chips are arranged on a planar top side of a semiconductor wafer and, by virtue of the flip-chip contacts, are not only electrically connected to the central region in the semiconductor chip positions but are also fixed in a form exhibiting extreme mechanical robustness, it is possible first of all to put on semiconductor chips which have a normal semiconductor chip thickness and not to perform thin-grinding until the second semiconductor chips are mechanically oriented and fixed in the component positions of the semiconductor wafer. This minimizes the rejection rate of thin-ground semiconductor chips, especially since after the thin-grinding these semiconductor chips are now in no way dangerous to handle, to transport or to process in another way. The costs for electronic components with stacked thin-ground semiconductor chips can thus be reduced.

As a result of the second semiconductor chips being put on and fitted, the top side of the semiconductor wafer becomes extremely unlevel and unusable for further processing steps. To provide a level, uniform layer for further processing steps, the semiconductor wafer therefore has a leveling layer on its top side, in which the second semiconductor chips are embedded. This has the associated advantage that this leveling layer can be followed by further layers, and additionally processing operations can also be performed photolithographically. Thus, vias can be made in the leveling layer by means of photolithography and by depositing metals, the cross section of said vias corresponding to that of the edge pads, and the metal column of said vias extending from the edge pads to the top side of the embedding layer.

In addition, the semiconductor wafer may already have a multilayer rewiring plane which has been put onto the leveling layer and has a rewiring structure which connects the vias to external pads of the rewiring structure via rewiring lines. Provided that the area of the semiconductor chip positions on the semiconductor wafer is sufficient for enough external contacts for an electronic component to be arranged thereon, the arrangement of vias and also of a rewiring plane and of external contacts directly on the semiconductor wafer has the advantage that electronic components with stacked semiconductor chips become able to be produced inexpensively in semiconductor chip size. If the semiconductor wafer already has external contacts, it is singulated into finished electronic components in a separating process.

However, if the semiconductor chip area in each semiconductor chip position of the semiconductor wafer is not sufficient for a sufficient number of external contacts to be arranged on the semiconductor wafer at this juncture, it is possible to provide a panel which provides any size of area for external contacts on an electronic component.

In contrast to the semiconductor wafer, such a panel has a top side which has component positions arranged in rows and columns and not just semiconductor chip positions. Within each component position, at least two semiconductor chips are stacked on one another. Semiconductor wafers of appropriate design can be separated into such semiconductor chip stacks even before the semiconductor wafers have vias, rewiring planes and/or external contacts, especially since these components may be arranged on the top side of the panel. To this end, at least the edges of the stacked semiconductor chips are embedded in the panel in a plastic compound to form a plastic composite plate, the stacked semiconductor chips having a leveling layer in which the respective second semiconductor chip is embedded.

The plastic compound and the top side of the leveling layers of the stacked semiconductor chips form a joint area on which a rewiring plane is arranged. This rewiring plane on a panel has a larger area than the rewiring plane on a semiconductor wafer, since it can extend over the leveling layer and over regions of the plastic compound. The panel can thus advantageously be used to provide far more external pads in the rewiring structure and accordingly also more external contacts on the electronic component in each of the component positions of the panel.

To connect both the second pads and the first central pads to the external contacts of the panel in each component position, there are, besides the rewiring plane, vias to the edge pads on the top side of the first semiconductor chip. The external contacts can be arranged on the external pads of the rewiring plane outside of the region of the leveling layer of the semiconductor chip stack and can thus be situated on the panel's plastic compound. In addition, they may be arranged on the leveling layer of the semiconductor stack. Finally, it is possible to provide the external contacts evenly distributed over every component position.

Components, which are separated from an appropriately designed semiconductor wafer or an appropriately finished panel have a first semiconductor chip which has a central region with central pads and an edge region with edge pads. In this case, the central pads are connected to the edge pads via interconnects. In addition, the electronic component has a second semiconductor chip which has second pads. The second semiconductor chip is arranged on the central region of the first semiconductor chip, and the central pads are electrically connected to the second pads. The second semiconductor chip is embedded in a leveling layer, the leveling layer having vias which are electrically connected to the edge pads.

In addition, the electronic component has a multilayer rewiring plane. This rewiring plane is arranged on the leveling layer and connects external contacts on the electronic component, which are arranged on external pads of the rewiring structure, via rewiring lines to vias, which for their part are connected to the edge pads.

Such an electronic component has the advantage that it has a physically compact design, requires a minimal number of production steps and thus becomes inexpensive to produce, and allows short connections between the central pads of the first semiconductor chip, the second pads of the second semiconductor chip and the external pads. The first semiconductor chip may have a larger top side and a greater thickness than the second semiconductor chip, which improves the compactness of the electronic component and reduces the space requirement for the electronic component.

The connections between first central pads and second pads can have flip-chip contacts whose areas are larger than the cross-sectional areas of the vias to the edge pads. These cross-sectional areas may be circular and implemented by columnar vias. An advantage of the smaller cross-sectional areas of the vias in comparison with the cross-sectional areas of flip-chip contacts is that a greater packing density for the vias can be achieved in the edge regions of the first semiconductor chip than in the case of flip-chip contacts in the central region of the first semiconductor chip.

The leveling layer on which the rewiring plane is arranged may comprise polyimide and have a thickness which is slightly greater than the thickness of thin-ground second semiconductor chips with their flip-chip contacts. The thickness of such a leveling layer may thus be between 80 and 120 µm if thin-ground semiconductor chips of between 50 and 70 µm are arranged as second semiconductor chips on the first semiconductor chip using flip-chip technology. In this case, the height of the flip-chip contacts is between 15 and 30 µm. By contrast, the diameters of the vias can be reduced down to 0.5 µm. Preferably, the diameters of the vias are in a range between 2 and 10 µm.

In one embodiment, a method for producing a semiconductor wafer with a plurality of semiconductor chip positions for a plurality of electronic components has the following method steps: first, a semiconductor wafer is provided which has semiconductor chip positions arranged in rows and columns with integrated circuits for first semiconductor chips. In this case, the semiconductor chip positions each have a central region with central pads and an edge region with edge pads. The central pads are electrically connected to the edge pads via interconnects.

This semiconductor wafer is fitted with second semiconductor chips in the central regions of the semiconductor chip positions so as to leave the edge pads free. Next, the second semiconductor chips, which are fixed on the semiconductor wafer, are thin-ground. A leveling compound is then applied onto the semiconductor wafer and has the second semiconductor chips embedded into it. When the leveling compound has been applied, it can be processed to form a leveling layer.

This method has the advantage that it is performed at wafer level and, in particular, the thin-grinding of the second semiconductor chips can be performed at wafer level, which means that it is possible to achieve an extremely low rejection rate. This is because the second semiconductor chips are extremely robust chips in their full thickness before they are thin-ground, and are fixed by the flip-chip contacts on the central region of each semiconductor chip position and do not need to be removed from these positions again after they are thin-ground.

The method also has the advantage that the finally produced semiconductor wafer has a level surface as a result of processing the leveling compound, on which further production can be performed simultaneously for all component positions. It is thus possible preferably to use photolithography to make passage openings in the leveling layer which are limited to the edge regions of the component positions with their edge pads. These passage openings can then be metallized by depositing metal or metal alloys in the passage openings so as to form vias to the edge pads. In this case, columnar vias are formed which can now be connected on the top side of the leveling layer to appropriate rewiring lines.

For electronic components which are intended to have the area size of the first semiconductor chip, the wafer can also be provided with a rewiring plane in which a rewiring structure has rewiring lines which are routed from the vias to external pads. On this rewiring plane with a rewiring structure, it is then also possible to put a solder resist layer which, of the rewiring structure, leaves free only the external pads, onto which external contacts are then put for such a wafer in a last method step. Such a wafer can then be separated into individual electronic components with stacked semiconductor chips.

If the area of a semiconductor chip position is not sufficient for putting on a sufficient and satisfactory amount of external contacts from an electronic component, a panel is produced before a rewiring plane is put on. To this end, the following method is performed; a semiconductor wafer with stacked semiconductor chips is separated into individual semiconductor chip stacks, each of these chip stacks having an embedding layer in which a second semiconductor chip is embedded which is connected to central contacts on a first semiconductor chip.

These semiconductor stacks which have been separated in this manner are put onto a support sheet, with the leveling layers being bonded onto the support sheet. The individual semiconductor chip stacks are put onto the support sheet in rows and columns for appropriately provided component positions on the panel. Next, the semiconductor chip stacks are embedded in a plastic compound so as to form a plastic composite plate. When the plastic compound which has been put on has cured, this plastic composite plate is self-supporting, which means that the support sheet can be removed from the plastic compound plate.

The support sheet has been used to produce a joint top side made of plastic and embedding layers for the individual semiconductor chip stacks. Passage openings are now made in the leveling layer to the edge pads of the first semiconductor chip using photolithography. The photolithography is used merely to perform the patterning, and a solvent is used to make the passage openings in the leveling layer.

Since the passage openings extend to the edge pads of the first semiconductor chip, it is now possible to produce a connection in the form of vias by filling the passage openings to the edge pads by means of chemical or electro deposition. Next, a rewiring plane with rewiring lines from the vias to the external pads of the rewiring plane is put on. When a solder resist layer has been put on so as to leave the external pads of the rewiring plane free, external contacts are put on to these external pads which have been left free. They can be put on by soldering on solder balls or solder bumps. To produce the electronic components, the panel needs to be sawn into individual electronic components or separated in another way.

In summary, it can be stated that the combination of a "fine-pitch compatible flip-chip mounting technology" with the "universal package" process approach allows the developer to provide access to contacts on the second semiconductor chip via contacts on the first semiconductor chip. This has the advantage of short signal paths, which are crucial for fast access and for short clock times in the case of semiconductor memories and microprocessors. Furthermore, the advantage arises of a very thin housing with a high density of lines as a result of thin-grinding at least one of the stacked semiconductor chips. Furthermore, it is possible to perform a wafer test as soon as the two semiconductor chips on a semiconductor wafer are connected to one another, since the edge pads in the edge region are accessible to test tips before a leveling compound is put on.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 8 illustrates a schematic cross section through a panel as illustrated in FIG. 7, with a rewiring plane put on.

FIG. 9 illustrates a schematic cross section through a panel as illustrated in FIG. 8, with external contacts put on.

DETAILED DESCRIPTION

Figure 1:
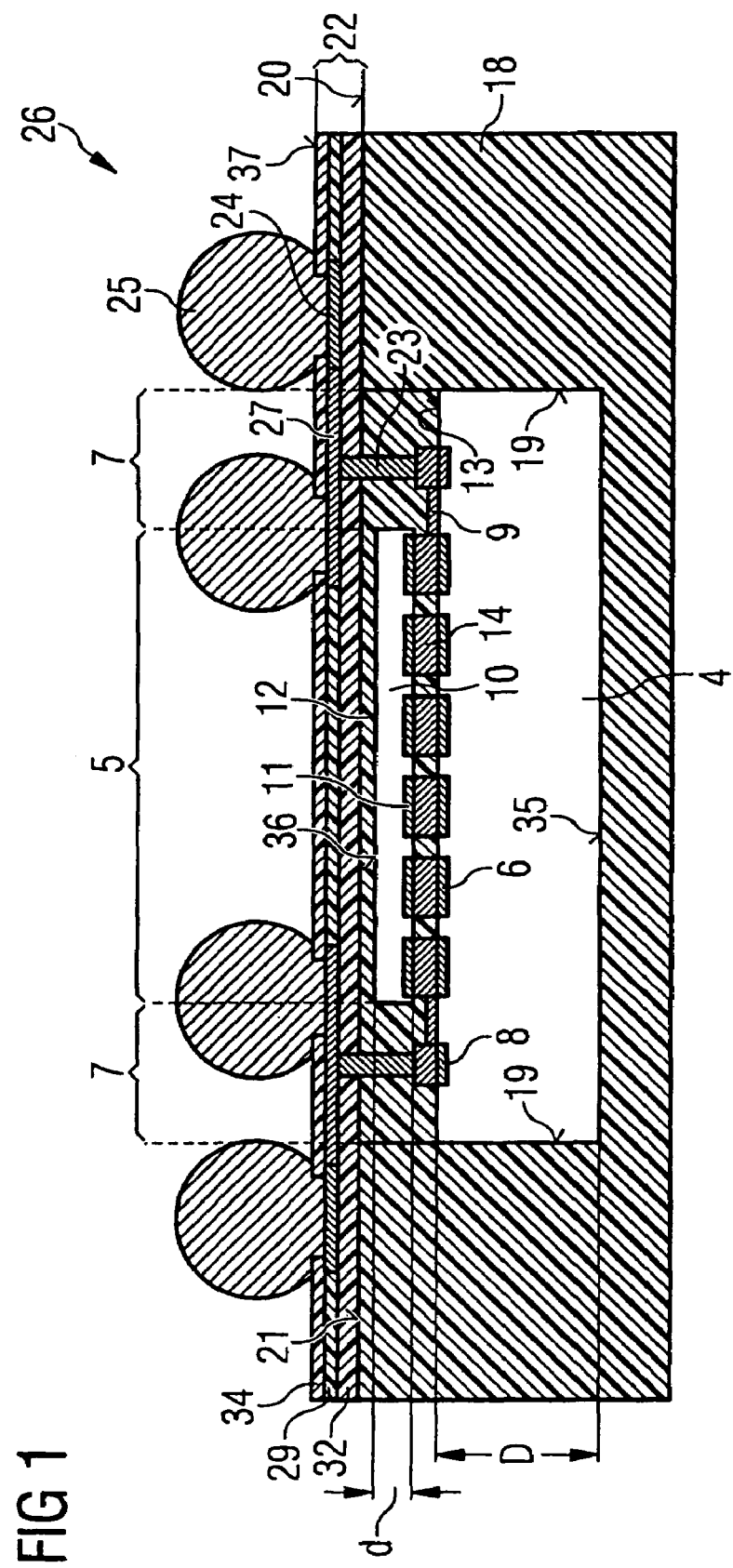
FIG. 1 illustrates a schematic cross section through an electronic component in one embodiment of the invention.

FIG. 1 illustrates a schematic cross section through an electronic component 26 in an embodiment of the invention. The electronic component 26 has a first semiconductor chip 4 with edges 19 and a back 35. The top side 13 of the first semiconductor chip 4 has central pads 6 in a central region 5 and edge pads in an edge region 7. A second semiconductor chip 10 having second pads 11 is arranged on the central region 5.

Arranged between the second pads 11 and the central pads 6 are flip-chip contacts 14. Interconnects 9 are routed from the central pads 6 to the edge pads 8. The central pads 6 and hence also every second pad 11 are connected to one of the edge pads 8 via interconnects 9. The second semiconductor chip 10 with its flip-chip contacts 14 is embedded in a leveling layer 12. This leveling layer 12 covers both the back 36 of the second semiconductor chip 10 and the edges 19 of this semiconductor chip 10, and fills interspaces between the flip-chip contacts 14.

Extending in the edge regions 7 are vias 23 from the edge pads 8 at least as far as the top side 20 of the leveling layer 12. The leveling layer 12 with its top side 20 and the plastic compound 18 in which the stack of two semiconductor chips 4 and 10 is embedded produce a joint area 21 on which a rewiring plane 22 is arranged. This rewiring plane 22 has two layers, a transitional layer 32, which is made of polyimide, and a rewiring layer 29, which has rewiring lines 27 which are connected to the vias 23. In addition, the rewiring structure of the rewiring layer 29 has external pads 24 which are occupied by external contacts 25. A solder stop layer is arranged on the rewiring structure of the rewiring layer 38 which leaves only the external pads 24 free, so that no solder can get to the rewiring lines 27 when the external contacts 25 are fused on.

Whereas the first semiconductor chip 4 has a thickness D which corresponds to that of a standard semiconductor wafer, the second semiconductor chip 10 is thin-ground, which means that a relatively compact electronic component 26 can be produced. In this embodiment of the invention, the external contacts 25 are arranged in two rows, but they may also be arranged evenly distributed over the top side 36 of the rewiring plane 22. In the case of this electronic component 26, there is no direct access to the flip-chip contacts 14 of the second electronic component 10, but the edge pads 8 in interaction with the vias 23 allow access to the flip-chip contacts 14 of the second semiconductor chip, too.

FIGS. 2 to 9 illustrate schematic cross sections through components of the invention after appropriate production processes. Components with the same functions as in FIGS. 2 to 9 are identified using the same reference symbols and for the most part are discussed just once.

Figure 2:
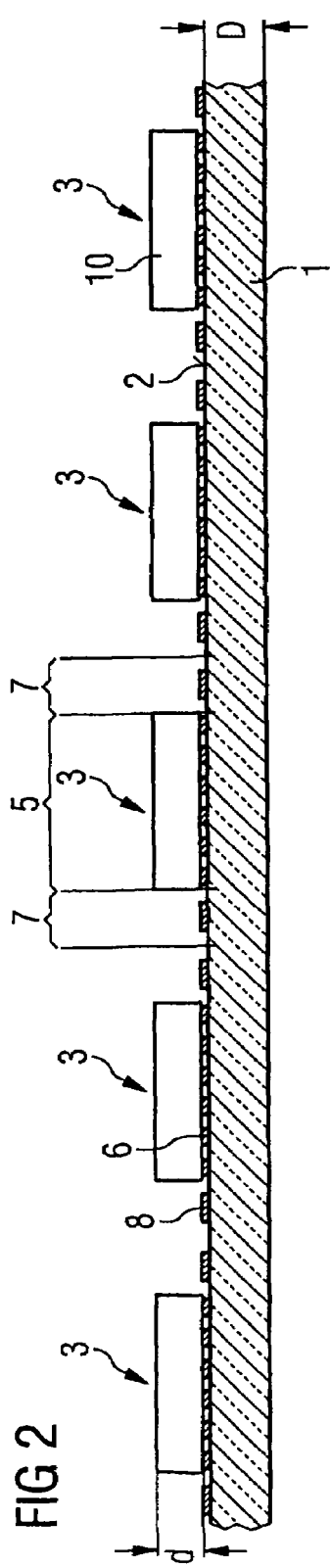
FIG. 2 illustrates a schematic cross section through a semiconductor wafer with semiconductor chip positions on which the second semiconductor chips are arranged.

FIG. 2 illustrates a schematic cross section through a semiconductor wafer 1 with semiconductor chip positions 3 on which second semiconductor chips 10 are arranged. Each component position 3 has a central region 5 with central pads 6. Arranged around the central region 5 is an edge region 7 in each component position, which supports edge pads 8. On the central region 5, the second semiconductor chip 10 is arranged such that its second pads are electrically connected to the central pads in each chip position. The thickness d of the second semiconductor chips 10 on the semiconductor wafer 1 corresponds approximately to the thickness D of the semiconductor wafer.

Figure 3:
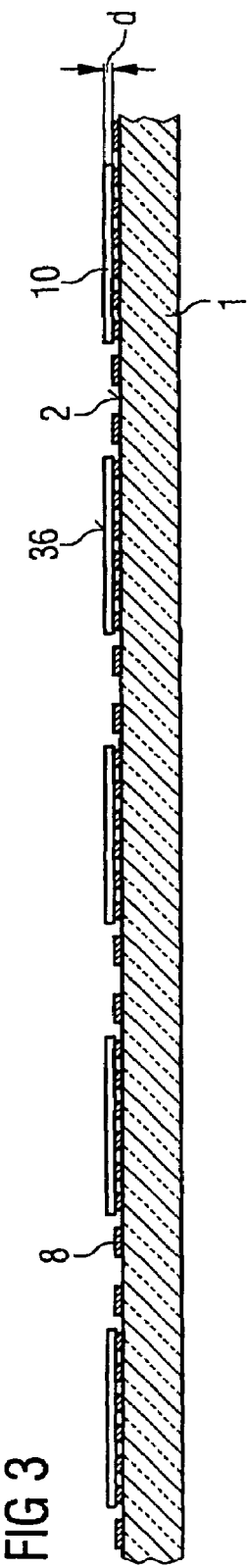
FIG. 3 illustrates a schematic cross section through the semiconductor wafer illustrated in FIG. 2 after the second semiconductor chips have been thin-ground.

FIG. 3 illustrates a schematic cross section through the semiconductor wafer 1 illustrated in FIG. 2 after the second semiconductor chips 10 have been thin-ground. Thin-grinding the semiconductor chips 10, which are arranged on the semiconductor wafer 1, makes it possible to achieve a thickness d of between 50 and 80 μm, in comparison with the thickness D of the semiconductor wafer 1 of between 500 and 750 μm. The thin-grinding is simplified by virtue of the semiconductor wafer 1 already having a planar top side 2 onto which the semiconductor chips 10 are put with flip-chip contacts which are approximately 20 μm thick and are reliably fixed using these flip-chip contacts during the thin-grinding operation.

Figure 4:
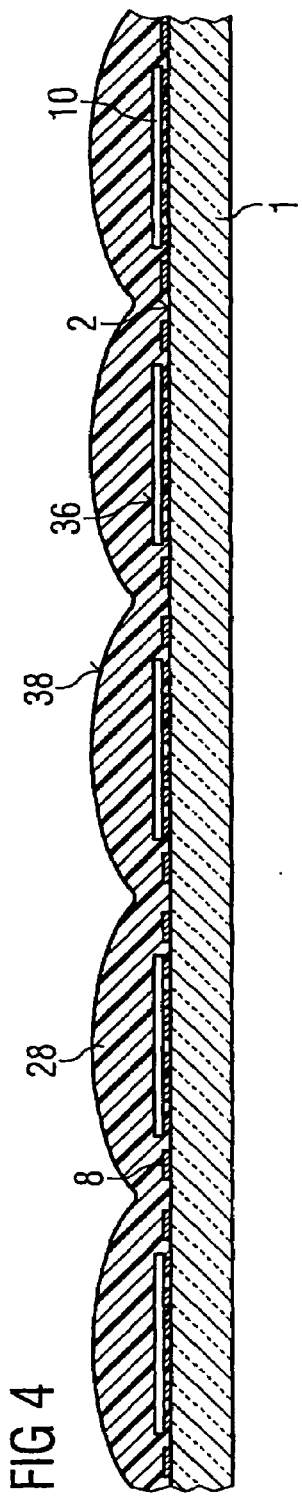
FIG. 4 illustrates a schematic cross section through a semiconductor wafer as illustrated in FIG. 3, after a leveling compound has been put onto the semiconductor wafer's top side fitted with second semiconductor chips.
Figure 5:
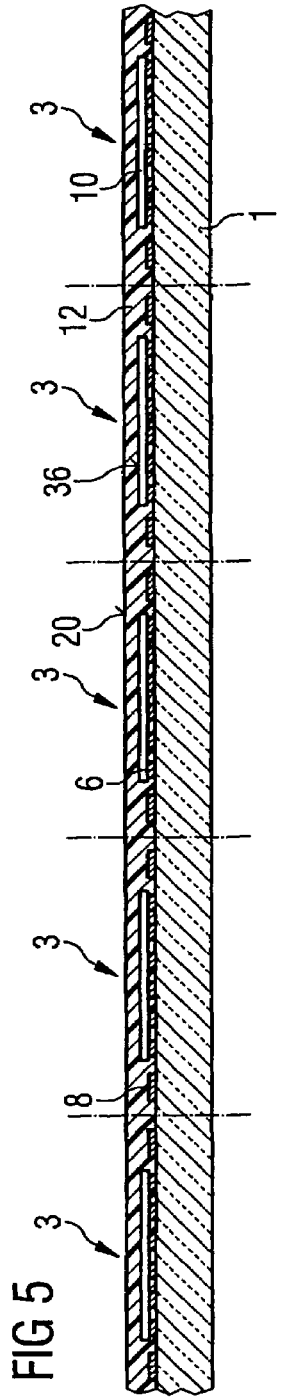
FIG. 5 illustrates a schematic cross section through the semiconductor wafer illustrated in FIG. 4, after the leveling compound has been processed to form a leveling layer.

FIG. 4 illustrates a schematic cross section through the semiconductor 1 illustrated in FIG. 3 after an embedding compound 28 has been put onto the top side 2 of the semiconductor wafer 1, which is fitted with semiconductor chips 10. This leveling compound, for example made of polyimide, is first of all applied in a runny form, which produces a relatively unlevel surface 37. This surface 37 can be processed, so that, as FIG. 5 shows, the leveling compound 28 is removed to produce a level leveling layer 12. A semiconductor wafer 1 as illustrated in FIG. 5 is already a commercially available product and can be sold inexpensively because it is possible to produce the stacking and thin-grinding of second semiconductor chips 10 on the semiconductor wafer 1 without significant rejects.

Figure 6:
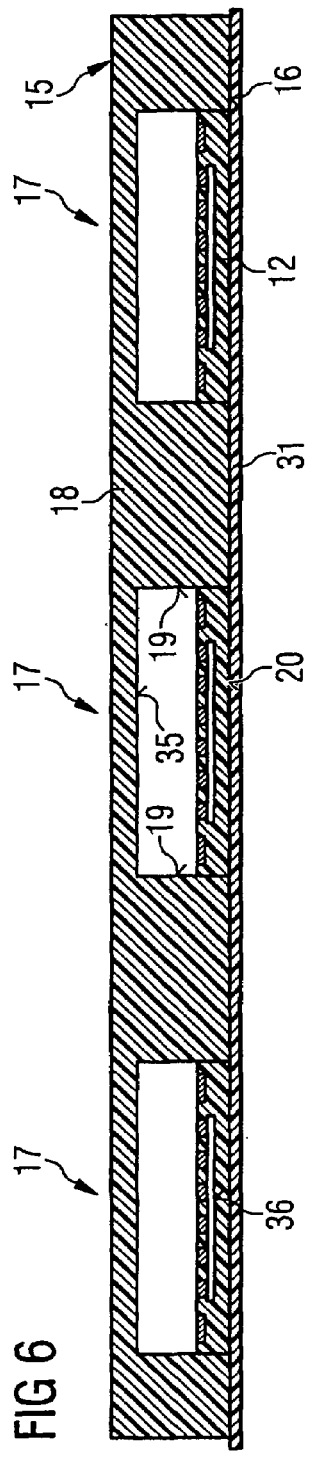
FIG. 6 illustrates a schematic cross section through a panel with stacked semiconductor chips, separated from the semiconductor wafer illustrated in FIG. 5, on a support sheet.

FIG. 6 illustrates a schematic cross section through a panel 15 with stacked semiconductor chips 4 and 10 on a support sheet 31 which have been separated from the semiconductor wafer 1 illustrated in FIG. 5. For this, the support sheet 31 has first of all been provided and the stacked semiconductor chips 4 and 10 obtained from the semiconductor wafer 1 in FIG. 5 have been arranged with their leveling layers 12 on the support sheet 31. Next, the interspaces between the stacked semiconductor chips 4 and 10 and the backs 35 of the first semiconductor chips 4 have been totally covered in plastic. The support sheet 31 prevents the top side 20 of the leveling layer 12 from also being covered in plastic, which means that, when the plastic compound 18 of the panel 15 has cured, the foil 31 can be removed from the component positions 17 of the panel 15.

Figure 7:
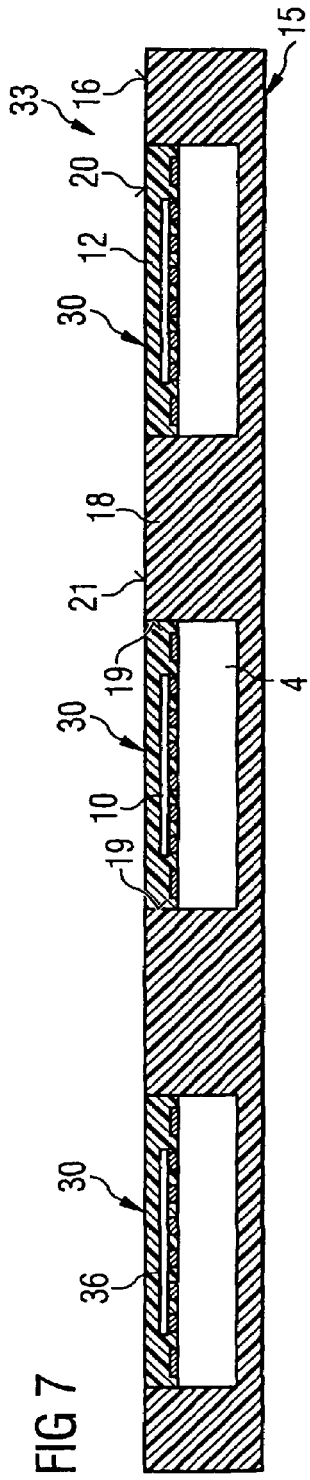
FIG. 7 illustrates a schematic cross section through a panel after the support sheet illustrated in FIG. 5 has been removed.

FIG. 7 illustrates a schematic cross section through a panel 15 after the support sheet 31 illustrated in FIG. 5 has been removed. The plastic compound plate 33 comprising plastic compound 18 and semiconductor chip stacks 30 is self-supporting and of robust form. The leveling layers 12 with their top sides 20 form a joint top side 21 with the plastic compound 18 arranged between them. This joint top side 21 is level or planar and it is thus possible to produce further patterning on this level area in order to produce electronic components in the component positions of the panel 15. First, openings are made in the leveling layers down to the edge pads using photolithography. These passage openings are then filled with a metal by electrodeposition to produce a via. When these vias, whose column diameter is smaller than the diameter of the flip-chip contacts of the second electronic component 10, have been produced, a rewiring plane can be put on the level top side 21. Even though the number of vias corresponds to the number of flip-chip contacts, the vias comprise a smaller area in the edge region of the first semiconductor chip 4 than the flip-chip contacts the central region of the first semiconductor chip 4.

FIG. 8 illustrates a schematic cross section through a panel 15 as illustrated in FIG. 7 with a rewiring plane 22 put on. This rewiring plane 22 has three layers, a transitional layer 32 made of polyimide, which is put as compensation onto the joint area 21 of the panel 15 so as to leave the vias 23 free, a further layer 29, which has a rewiring structure which has rewiring lines 27 and external pads 24, with the rewiring lines 27 connecting the vias 23 to the external pads 24.

FIG. 9 illustrates a schematic cross section through a panel 15 as illustrated in FIG. 8 with external contacts 25 applied. This means that in every component position 17 of the panel 15 a complete component with stacked semiconductor chips is finished and the panel 15 can be split along the separating lines 39 to form individual components. This sequence of processes in the method from a semiconductor wafer through to a panel 15 which can be split to form components is used when the area of the first semiconductor chip is not sufficient to provide enough space for external contacts 25. If the surface of the semiconductor chip is sufficient, however, for enough external contacts to be put directly on a rewiring plane on the semiconductor chip, it is possible to dispense with producing a panel 15, and all processes for producing an electronic component with stacked semiconductor chips take place directly on a semiconductor wafer.

The invention claimed is:

1. A semiconductor wafer comprising:
   a top side that comprises semiconductor chip positions arranged in rows and columns with integrated circuits for first semiconductor chips, the first semiconductor chips each having a top side with a central region with central pads and an edge region with edge pads, wherein the central pads are connected to the edge pads via interconnects;
   second semiconductor chips which comprise second pads, the second semiconductor chips being fitted on the central regions of the first semiconductor chips, and the first central pads being electrically connected to the second pads; and
   a leveling layer on the top side of the semiconductor wafer, the second semiconductor chips being embedded in the leveling layer.

2. The semiconductor wafer according to claim 1, comprising wherein the edge pads are smaller than the central pads.

3. The semiconductor wafer according to claim 1, comprising wherein the packing density of the edge pads is greater than the packing density of the central pads.

4. The semiconductor wafer according to claim 1, comprising wherein the thickness of the second semiconductor chips is less than the thickness of the semiconductor wafer for the first semiconductor chips.

5. The semiconductor wafer according to claim 1, comprising wherein the second semiconductor chip comprises flip-chip contacts that are electrically connected to the central pads and are surrounded by the leveling layer.

6. A panel comprising:
   a top side which has component positions arranged in rows and columns;
   at least two stacked semiconductor chips in each component position with a first semiconductor chip which has a top side with a central region with central pads and an edge region with edge pads, the central pads being connected to edge pads via interconnects;
   a second semiconductor chip with second pads which is fitted on the central region of the first semiconductor chip, and the first central pads being electrically conductively connected to the second pads;
   a plastic compound in which the stacked semiconductor chips have at least their edges embedded; and
   a leveling layer in which the second semiconductor chip is embedded, wherein the plastic compound and the top sides of the leveling layers of the stacked semiconductor chips form a joint area on which a rewiring plane is arranged.

7. The panel according to claim 6, comprising wherein the leveling layer comprises vias to the edge pads.

8. The panel according to claim 6, comprising wherein the rewiring plane comprises external pads on which external contacts are arranged evenly distributed over each component position.

9. An electronic component comprising:
   a first semiconductor chip which has a top side having a central region with central pads and an edge region with edge pads, the central pads being connected to the edge pads via interconnects;
   a second semiconductor chip which comprises second pads, the second semiconductor chip being fitted on the central region of the first semiconductor chip, and the first central pads being electrically connected to the second pads;
   a leveling layer in which the second semiconductor chip is embedded, the leveling layer comprising vias which are electrically connected to the edge pads; and
   a multilayer rewiring plane which is arranged on the leveling layer and comprises external contacts from the electronic component which are electrically connected to the vias via rewiring lines.

10. The electronic component according to claim 9, comprising wherein the first semiconductor chips comprise a larger top side and a greater thickness than the second semiconductor chips.

11. electronic component according to claim 9, comprising wherein the second semiconductor chip comprises flip-chip contacts, and the cross-sectional areas of the flip-chip contacts are larger than the cross-sectional areas of the vias.

12. The electronic component according to claim 9, comprising wherein the vias are columnar.

13. The electronic component according to claim 9, comprising wherein the via have a greater packing density than the flip-chip contacts of the second semiconductor chip.

14. The electronic component according to claim 12, comprising wherein the step size or grid dimension between the vias is smaller than the step size or grid dimension between flip-chip contacts.

15. The electronic component according to claim 9, comprising wherein the leveling layer comprises polyimide.

16. A method for producing a semiconductor wafer with a plurality of semiconductor chip positions for a plurality of electronic components, the method comprising:
   providing a semiconductor wafer that comprises semiconductor chip positions arranged in rows and columns with integrated circuits for first semiconductor chips, the semiconductor chip positions each comprising a central region with central pads and an edge region with edge pads, and the central pads being electrically connected to the edge pads via interconnects;
   fitting the semiconductor wafer with second semiconductor chips in central regions of the semiconductor chip positions so as to leave the edge pads free;
   thin-grinding the second semiconductor chips on the semiconductor wafer;
   putting a leveling compound onto the semiconductor wafer so as to embed the second semiconductor chips; and
   processing the leveling compound to form a leveling layer.

17. The method according to claim 16, comprising wherein after the leveling layer has been produced the following method is performed:
   making passage openings in the leveling layer in the edge regions of the component positions as far as the edge pads; and
   depositing metal or metal alloys in the passage openings to form vias.

18. A method for producing a panel with semiconductor chip stacks following production of a semiconductor wafer in line with the method according to claim 16, comprising:
   separating a semiconductor wafer with stacked semiconductor chips into individual semiconductor chip stacks which have a first and a second semiconductor chip, the second semiconductor chip being embedded in a leveling layer;
   putting the semiconductor chip stacks with their leveling layers onto a support sheet;
   embedding the semiconductor chip stacks into a plastic compound to form a plastic compound plate;
   removing the support sheet from the plastic compound plate;

making passage openings to the edge pads of the first semiconductor chip in the leveling layer;

filling the passage openings with copper or with a copper alloy to form vias;

applying a rewiring plane with rewiring lines from the vias to external pads of the rewiring plane;

applying a solder stop layer is applied onto the rewiring plane so as to leave the external pads free; and putting external contacts onto the external pads.

19. A method for producing an electronic component with a plurality of semiconductor chips, where the method comprising:

providing a semiconductor wafer which has semiconductor chip positions arranged in rows and columns with integrated circuits for first semiconductor chips, the semiconductor chip positions each comprising a central region with central pads and an edge region with edge pads, and the central pads being electrically connected to the edge pads via interconnects;

fitting the semiconductor wafer with second semiconductor chips in central regions of the semiconductor chip positions so as to leave the edge pads free;

thin-grinding the second semiconductor chips on the semiconductor wafer;

putting a leveling compound onto the semiconductor wafer so as to embed the second semiconductor chips;

processing the leveling compound to form a leveling layer;

making passage openings in the leveling layer in the edge regions of the component positions as far as the edge pads;

depositing metal or metal alloys in the passage openings to form vias;

separating a semiconductor wafer with stacked semiconductor chips into individual semiconductor chip stacks which comprise a first and a second semiconductor chip, the second semiconductor chip being embedded in a leveling layer;

applying a rewiring plane with rewiring lines from the vias to external pads of the rewiring plane;

putting a solder stop layer onto the rewiring plane of the semiconductor wafer so as to leave the external pads free;

applying external contacts onto the external pads; and splitting the semiconductor wafer into individual electronic components.

20. A method for producing an electronic component comprising:

producing a panel according to claim 18; and separating the panel into individual electronic components.

21. The panel according to claim 6, comprising wherein a rear side and side faces of the first semiconductor chip and side faces of the leveling layer are completely embedded in the plastic compound, and wherein a top side of the plastic compound and the top side of the leveling layer form a planar surface upon which the rewiring plane is arranged 22. The electronic component according to claim 9, comprising wherein a rear side and side faces of the first semiconductor chip and side faces of the leveling layer are completely embedded in a plastic compound, and wherein a top side of the plastic compound and the top side of the leveling layer form a planar surface upon which the rewiring plane is arranged.

* * * * *

UNITED STATES PATENT AND TRADEMARK OFFICE
CERTIFICATE OF CORRECTION

| | | |
|---|---|---|
| PATENT NO. | : 7,701,066 B2 | Page 1 of 1 |
| APPLICATION NO. | : 10/555858 | |
| DATED | : April 20, 2010 | |
| INVENTOR(S) | : Goller | |

It is certified that error appears in the above-identified patent and that said Letters Patent is hereby corrected as shown below:

Column 10, line 12, delete "electronic" and insert in place thereof --The electronic--.

Signed and Sealed this

Fifth Day of October, 2010

David J. Kappos
*Director of the United States Patent and Trademark Office*